(12) United States Patent
Fujio et al.

(10) Patent No.: US 6,195,288 B1
(45) Date of Patent: Feb. 27, 2001

(54) NONVOLATILE SEMICONDUCTOR MEMORY DEVICE

(75) Inventors: Ryosuke Fujio; Kazuo Watanabe, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/566,882

(22) Filed: May 8, 2000

(30) Foreign Application Priority Data

May 7, 1999 (JP) .................................................. 11-127828

(51) Int. Cl.[7] .................................................. G11C 16/06
(52) U.S. Cl. .................................. 365/185.2; 365/185.21
(58) Field of Search ........................... 365/185.2, 185.21, 365/185.23, 185.29, 185.33

(56) References Cited

U.S. PATENT DOCUMENTS

| | | | |
|---|---|---|---|
| 5,511,020 | * 4/1996 | Hu et al. ........................... | 365/185.21 |
| 5,815,434 | * 9/1998 | Hasbun et al. .................... | 365/185.33 |
| 5,936,884 | * 8/1999 | Hasbun et al. .................... | 365/185.29 |

\* cited by examiner

*Primary Examiner*—Trong Phan
(74) *Attorney, Agent, or Firm*—Hutchins, Wheeler & Dittmar

(57) ABSTRACT

A nonvolatile semiconductor memory device disclosed herein includes: a reference cell held in an ON-state; a reference cell held in an OFF-state; a driving transistor which is turned ON by a signal for reading out data from a memory cell, to supply a current to the memory cell; driving transistors which have a same construction and characteristics as the driving transistor and also which are turned ON by that signal to supply a current to the reference cells; and a sense-amplifier which has a first input terminal supplied with an output voltage of the driving transistor and a second input terminal supplied with an average $(V_{Ron}+V_{Roff})/2$ of output voltages $V_{Ron}$ and $V_{Roff}$ of the driving transistors respectively.

6 Claims, 4 Drawing Sheets

NONVOLATILE SEMICONDUCTOR MEMORY DEVICE

BACKGROUND OF THE INVENTION

1. Field of the Invention

The present invention relates to a nonvolatile semiconductor memory device which holds data stored in a memory cell even if power is turned OFF and more particularly to the nonvolatile semiconductor memory device such as a flash EEPROM.

2. Description of the Related Art

A nonvolatile semiconductor memory device in an example shown in FIG. 3 includes: memory cells $1_m$ (m=1, 2, . . . , M); selecting cells $2_{1m}$ and $2_{2m}$; a word line 3; first and second column lines $4_1$ and $4_2$; a word line drive circuit 5; column selecting circuits $6_1$ and $6_2$; a reading-out circuit 7; an inverter 8; a read-out drive section $9_m$; a reference section 10; a sense-amplifier $11_m$; and a data bus 12. Note here that this example is a circuit related to reading out data and a circuit related to data write-in and erasure is not shown.

The memory cell $1_m$ includes a MOS transistor which has a usual gate (control gate) and also a floating gate electrically insulated from a surrounding in such a configuration that each control gate is connected through the word line 3 and also, through the word line 3, connected to an output terminal of the word line drive circuit 5. In each memory cell $1_m$, when a sufficiently higher voltage (10–20V) than that applied to a drain is applied to the control gate, electrons are stored from the drain into the floating gate (write-in operation) and, when polarity of the voltage applied to the control gate is changed, those electrons stored in the floating gate are moved to the drain (erasure operation). Therefore, in a case where no electrons are stored in the floating gate of each memory cell $1_m$, when a command for reading out data is supplied from outside to permit the word-line drive circuit 5 to apply an "H" level signal to the word line 3, the "H" level signal is applied to the control gate, thus turning ON the memory cell $1_m$. In a case where electrons are stored in the floating gate, on an other hand, even when the "H" level signal is applied from the word-line drive circuit 5 to the word line 3 to apply the "H" level signal to the control gate, a negative charge of the electrons stored in the floating gate inhibits a channel from being induced, so that the memory cell $1_m$ is not turned ON and stays in an OFF-state, thus raising a threshold voltage VT. These ON-states and OFF-states correspond to one-bit states of "0" and "1" respectively.

The selecting cells $2_{1m}$ each consist of a MOS transistor and are connected to one another at their gate through the first column line $4_1$ and also, therethrough, to an output terminal of the column selecting circuit $6_1$. The column selecting circuit $6_1$, when the first column line $4_1$ is selected as a result of a first-stage decoding of addresses supplied from outside, applies an "H" level signal to that first column line $4_1$. With this, the selecting cell $2_{1m}$ is supplied with the "H" level signal at its gate and so turned ON, to form a path through which data is read out from the memory cell $1_m$.

The selecting cells $2_{2m}$ each consist of a MOS transistor and are connected at their gate to one another through the second column line $4_2$ and also, therethrough, to an output terminal of the column selecting circuit $6_2$. The column selecting circuit $6_2$, when that second column line $4_2$ is selected as a result of a second-stage decoding of addresses supplied from the outside, applies an "H" level signal to that second column line $4_2$. With this, the selecting cell $2_{2m}$ is supplied with the "H" level signal and so turned ON, to form a path through which data is read out from the memory cell $1_m$.

The reading-out circuit 7, when supplied with a data-read-out command from the outside, supplies an "H" level signal which indicates a start of a data read-out operation, to the inverter 8, the read-out driving circuit section $9_m$, and the reference section 10. The inverter 8 inverts the "H" level signal supplied from the reading-out circuit 7 into an "L" level signal and then supplies it to the read-out driving section 9, and the reference section 10.

The read-out driving section $9_m$ roughly includes a driving transistor $13_m$, a path forming transistor $14_m$, a path cutting-off transistor $15_m$, and a NOR gate $16_m$.

The driving transistor $13_m$ consists of a MOS transistor and is turned ON by an "H" level signal supplied from the reading-out circuit 7 in order to apply a voltage V, which corresponds to an ON-state or OFF-state of the memory cell $1_m$, to a first input terminal of the sense-amplifier $11_m$. The path forming transistor $14_m$ consists of a MOS transistor and is turned ON by an "H" level signal supplied from the NOR gate $16_m$. in order to form a path for reading out data from the memory cell $1_m$. The path cutting-off transistor 15, consists of a MOS transistor and is turned ON by an "H" level signal supplied from the inverter 8 in order to cut off a path for reading out data from the memory cell $1_m$. The NOR gate $16_m$, which has its first input terminal supplied with an output signal of the inverter 8 and its second input terminal connected with a source of the path forming transistor $14_m$, outputs an "H" level signal to turn ON the path forming transistor 14. when both the output signal of the inverter 8 and the source voltage of the path forming transistor $14_m$ are of an "L" level.

The reference section 10 roughly includes a reference cell 21, selecting cells $22_1$ and $22_2$, a word-line driving circuit 23, column selecting circuits $24_1$ and $24_2$, a driving transistor 25, a path forming transistor 26, a path cutting-off transistor 27, and a NOR gate 28.

The reference cell 21 consists of a MOS transistor having a same construction and characteristics as the memory cell $1_m$ and is set beforehand in such a state that no electrons are stored in its floating gate, an ON-state. The selecting cell $22_1$, the selecting cell $22_2$, the word-line driving circuit 23, the column selecting circuit $24_1$, the column selecting circuit $24_2$, the path forming transistor 26, the path cutting-out transistor 27, and the NOR gate 28 have a same construction and characteristics as the selecting cell $21_m$, the selecting cell $22_m$, the word-line driving circuit 5, the column selecting circuit $6_1$, the column selecting circuit $6_2$, the path forming transistor $14_m$, the path cutting-off transistor $14_m$, the path cutting-out transistor $15_m$, and the NOR gate $16_m$. respectively. This is so set that the sense-amplifier $11_m$, including a differential amplifier, may have its first and second input terminals respectively connected with two loads equal as much as possible.

Since the read-out driving section $9_m$ is provided one for each memory cell $1_m$ and, on the other hand, the reference section 10 is provided one for M number of the sense-amplifiers $11_m$, the driving transistor 25 generally has two to three times the size of the driving transistor $13_m$ in order to acquire a current driving capability. The driving transistor 25, when turned ON by an "H" level signal supplied from the reading-out circuit 7, applies a voltage $V_R$ which corresponds to the ON-state of the reference cell 21, to the second input terminal of the sense-amplifier $11_m$.

The sense-amplifier $11_m$, as mentioned above, includes a differential amplifier, so that it detects and amplifies a difference between a voltage supplied from the read-out driving section $9_m$ and a voltage $V_R$ supplied from the reference section 10 and then outputs data via the data bus to the outside.

Steady characteristics of such prior-art nonvolatile semiconductor memory device are represented by a curve a for the voltage vs. current characteristic of the driving transistor $13_m$ and a curve b for the voltage vs. current characteristics of the driving transistor $25_m$ as shown in FIG. 4. That is, the driving transistors $13_m$ and 25 have different current driving capabilities because of their different sizes, hence different gradients in their characteristics curves. The reason is described as follows.

In the case where no electrons are stored in the floating gate of the memory cell $1_m$, when an "H" level signal is applied to the control gate of the memory cell $1_m$ with the driving transistor $13_m$, the path forming transistor $14_m$, and the selecting cells $21_m$ and $2_{2m}$ held in the ON-state, the memory cell lm is turned ON, so that a voltage $V_{DM}$ applied by the driving transistor $13_m$ to the first input terminal of the sense-amplifier $11_m$ drops in voltage from a power-supply voltage $V_{CC}$ by a voltage value corresponding to a total of the turn ON resistances of the path forming transistor 14, the selecting cells $21_m$ and $2_{2m}$, and the memory cell $1_m$, down to a voltage $V_{Don}$, thereby flowing a current $I_{on}$ through the driving transistor $13_m$ as indicated by a point A in FIG. 4.

In the case where electrons are stored in the floating gate of the memory cell $1_m$, on the other hand, even when an "H" level signal is applied with the driving transistor $13_m$, the path forming transistor $14_m$, and the selecting cells $2_{1m}$ and $2_{2m}$ held in the ON-state, the memory cell still stays in the OFF-state, so that the voltage $V_{DM}$ applied by the driving transistor $13_m$ to the first input terminal of the sense-amplifier 11 becomes roughly equal to the power-supply voltage $V_{CC}$, thereby permitting little current to flow through the driving transistor $13_m$ as indicated by a point B in FIG. 4.

Thus, when the memory cell $1_m$ is in the ON-state, the voltage $V_{DM}$ becomes the voltage $V_{Don}$ and, when it is in the OFF-state, the voltage $V_{DM}$ roughly becomes the power-supply voltage $V_{CC}$; with this, in order that the sense-amplifier $11_m$ can detect whether the memory cell $1_m$ is in the ON-state or the OFF-state, the driving transistor 25 is sized to have such voltage vs. current characteristics that the voltage $V_R$ applied to the second input terminal of the sense-amplifier $11_m$ by the driving transistor 25 when the reference cell 21 is in the ON-state may be approximately at the middle between the voltage $V_{Don}$ and the power-supply voltage $V_{CC}$ (see a point C in FIG. 4).

In the above-mentioned prior-art nonvolatile semiconductor memory device, however, when the path forming transistor $14_m$ and the selecting cells $2_{1m}$ and $2_{2m}$ are turned ON, the memory cell 11 is directly connected to the first input terminal of the sense-amplifier $11_m$, so that when the memory cell $1_m$ is in the ON-state, the memory cell $1_m$ itself acts to pull the voltage $V_{DM}$ applied to the first input terminal of the sense-amplifier $11_m$ from the power-supply voltage $V_{CC}$ down to the voltage $V_{Don}$.

With increasing integration densities and fine patterning degrees of nonvolatile semiconductor memory devices in recent years, a current flowing through the memory cell $1_m$ has been more and more reduced to a very small value of 10–20 µA, so that it takes rather a long time for the memory cell $1_m$ to be pulled in voltage from $V_{DM}$ down to $V_{Don}$, thus delaying the time for reading out data.

In the above-mentioned prior-art nonvolatile semiconductor memory cell, moreover, one reference section 10 drives M number of sense-amplifiers $11_m$, so that the driving transistor 25 must be sized two to three times as large as the driving transistor $13_m$, which leads to a following problem.

That is, when the device starts to read out data, both the voltages $V_{DM}$ and $V_R$ applied to the first and second input terminals respectively of the sense-amplifier urn rise in level along almost the same course as shown in FIG. 5 until the selecting cells $2_{1m}$ and $2_{2m}$ and the selecting cells $22_1$ and $22_2$ are turned ON (all of which are done so almost simultaneously), up to a time $t_1$.

However, as mentioned above, the driving transistor 25 is large in size and so has a large current driving capability, so that immediately after the selecting cells $2_{1m}$ and $2_{2m}$ and the selecting cells $22_1$ and $22_2$ are turned ON, the voltage $V_R$ starts rising more steeply than the voltage $V_{DM}$ as shown by a curve c.

When an "H" level signal is applied to the word line 3 afterward (time $t_2$), the voltage $V_R$ keeps on rising at a same gradient up to a timet$_2$ and then is saturated because the word-line driving circuit 23 is a dummy. The voltage $V_{DM}$, on the other hand, lowers to some extent (see a curve a in FIG. 5) because the memory cell $1_m$ is turned ON when no electrons are stored in the floating gate of the memory cell $1_m$ and, when electrons are stored in the floating gate of the memory cell $1_m$, rises further (see a broken-line curve b in FIG. 5) because the memory cell lm stays OFF.

Therefore, until a time $t_3$ comes, it cannot accurately be decided whether the voltage $V_{DM}$ is larger or smaller than the voltage $V_R$; that is, from the time $t_2$ up to the time $t_3$, data cannot be supplied to the data bus, thus taking rather long read-out time.

In the above-mentioned prior-art nonvolatile semiconductor memory device, further, although the sense-amplifier $11_m$ is a differential amplifier, only one of its two differential inputs is given a heavy load, so that unbalance such as occurrence of an offset voltage is liable to occur. Therefore, if unbalance exists between the two input terminals of the sense-amplifier $11_m$, there is obtained no margin based on which the ON/OFF-state is decided of the memory cell $1_m$, so that the data cannot accurately be detected or amplified. One measure for preventing the occurrence of such unbalance may be to reduce the value of the number M of the sense-amplifiers $11_m$, which, however, would suppress an enhancement in integration density of the nonvolatile semiconductor memory device.

In the above-mentioned prior-art nonvolatile semiconductor memory device, even further, a sufficient margin to detect the OFF-state of the memory cell $1_m$ can be obtained only if little current flows through the driving transistor $13_m$ even when it is turned ON with the memory cell lm held in the OFF-state, so that a sufficient amount of electrons need to be stored in the floating gate of the memory cell $1_m$ in order to write in data. It takes, however, rather long time to store electrons sufficiently in the floating gate, which may lead to the prolonged write-in time.

SUMMARY OF THE INVENTION

In view of the above, it is an object of the present invention to provide a nonvolatile semiconductor memory device which makes it possible to reduce both a data write-in time and read-out time, to acquire a sufficient margin to detect an ON/OFF-state of a memory cell, and to enhance its own integration density.

According to a first aspect of the present invention, there is provided a nonvolatile semiconductor memory device in which, based on a voltage difference between a voltage which corresponds to a data storage state of a memory cell and a voltage which corresponds to a pseudo-data storage state of a reference cell, data stored in the memory cell is read out;

wherein the reference cell includes a first reference cell held in a state where the pseudo-data is written therein and a second reference cell held in a state where the pseudo-data is erased therefrom, the nonvolatile semiconductor memory device including:

a first driving transistor which is turned ON by a signal for reading out the data, to supply a current to the memory cell;

a second driving transistor and a third driving transistor which have same construction and characteristics as the first driving transistor and also which are turned ON by the signal, to supply a current to the first and second reference cells respectively; and a sense-amplifier which has a first input terminal supplied with an output voltage of the first driving transistor a second input terminal supplied with an average of an output voltage of the second driving transistor and an output voltage of the third driving transistor, in order to detect the voltage difference.

In the foregoing, a preferable mode is one wherein the first and second reference cells and the second and third driving transistors are each provided in common to a plurality of memory cells.

Also, according to a second aspect of the present invention, there is provided a nonvolatile semiconductor memory device wherein based on a voltage difference between a voltage which corresponds to a data storage state of a memory cell and a voltage which corresponds to a pseudo-data storage state of a reference cell, data stored in the memory cell is read out, the nonvolatile semiconductor memory device including:

a first driving transistor which is turned ON by a signal for reading out the data, to supply a current to the memory cell:

a second driving transistor which has same construction and characteristics as the first driving transistor and also which is turned ON by the signal, to supply a current to the reference cell;

a first buffer for amplifying an output of the first driving transistor and supplying the output to a first input terminal of a sense-amplifier for detecting the voltage difference; and a second buffer- for amplifying an output of the second driving transistor and supplying the output to a second input terminal of the sense-amplifier.

In the foregoing, a preferable mode is one where in the second driving transistor and the second buffer are each provided in common to a plurality of memory cells.

Also, according to a third aspect of the present invention, there is provided a nonvolatile semiconductor memory device in which, based on a voltage difference between a voltage which corresponds to a data storage state of a memory cell and a voltage which corresponds to a pseudo-data storage state of a reference cell, data stored in the memory cell is read out;

wherein the reference cell includes a first reference cell held in a state where the pseudo-data is written therein and a second reference cell held in a state where the pseudo-data is erased therefrom, the nonvolatile semiconductor memory device including:

a first driving transistor which is turned ON by a signal for reading out the data, to supply a current to the memory cell;

a second driving transistor and a third driving transistor which have same construction and characteristics as the first driving transistor which is turned ON by the signal, to supply a current to the first and second reference cells respectively;

a first buffer for amplifying an output of the first driving transistor and supplying the output to a first input terminal of a sense-amplifier for detecting the voltage difference; and a second buffer for amplifying outputs of the second and third driving transistors respectively and supplying an average of the outputs to a second input terminal of the sense-amplifier.

In the foregoing, a preferable mode is one wherein the first and second reference cells and the second and third driving transistors are each provided in common to a plurality of memory cells.

With the above configuration, it is possible to reduce both time for writing in data and time for reading it out. It is also possible to acquire the sufficient margin to detect the ON/OFF-state of the memory cell. With it, further, the nonvolatile semiconductor memory device can be enhanced in its integration density.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

The following will describe embodiments of the present invention with reference to the accompanying drawings. The description is made specifically using examples.

Figure 1:
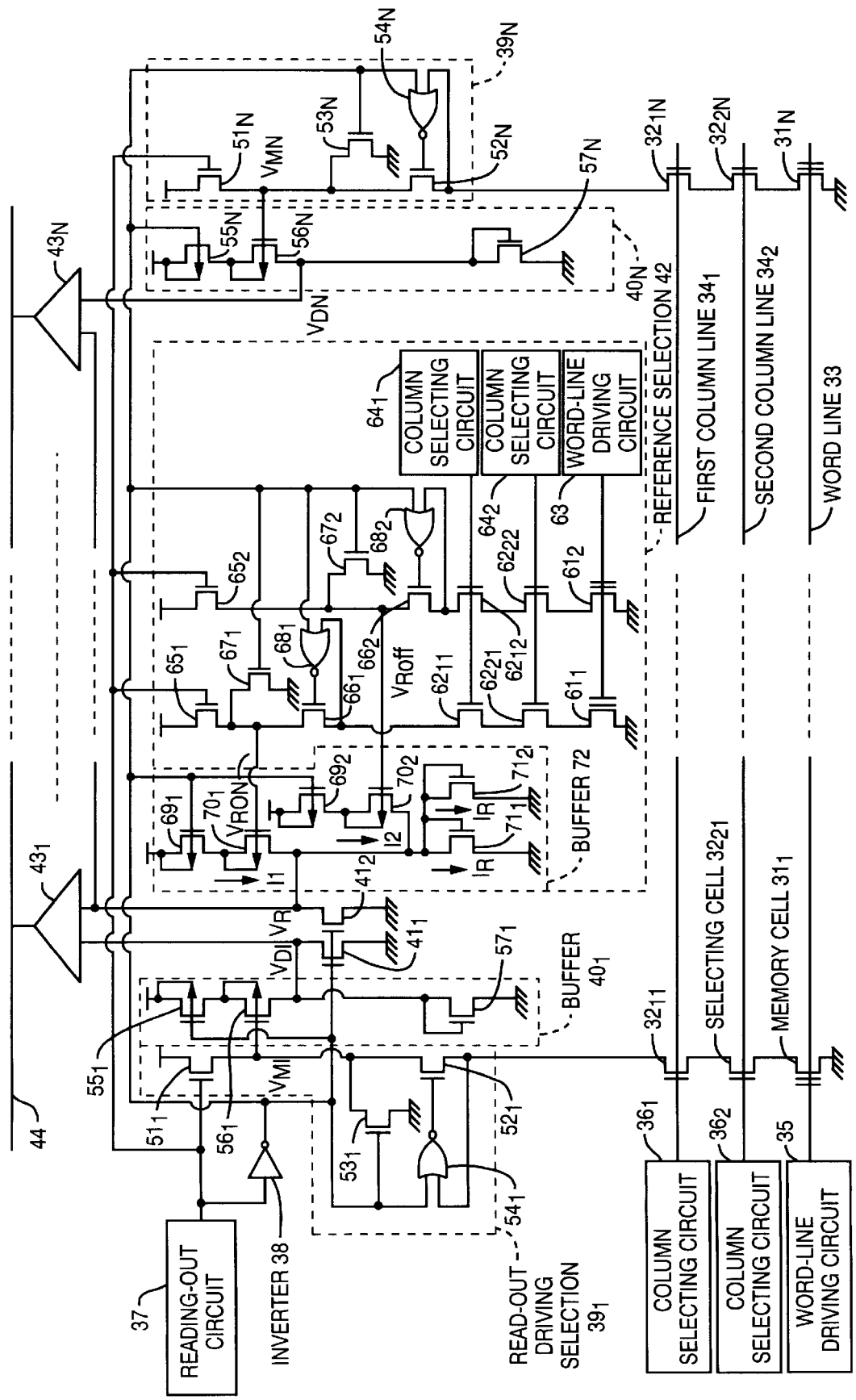
FIG. 1 is a circuit diagram indicating an electric configuration of important parts of a nonvolatile semiconductor memory device according to one embodiment of the present invention.

As shown in FIG. 1., a nonvolatile semiconductor memory device according to this embodiment roughly includes memory cells $31_n$(n=1, 2, . . . , N), selecting cells $32_{1n}$ and $32_{2n}$, a word line 33, first and second column lines $34_1$ and $34_2$, a word-line driving circuit 35, column selecting circuits $36_1$ and $36_2$, a reading-out circuit 37, an inverter 38, reading-out sections $39_n$, buffers $40_n$, path cutting-off transistors $41_1$ and $41_2$, a reference section 42, sense-amplifiers $43_n$, and a data bus 44. Note here that this example relates to a circuit for reading out data, so that the circuit for writing in data and the circuit for erasing data are not shown.

The memory cells $31_n$ consists of a MOS transistor which has a control gate and a floating gate in such a configuration that its control gate is connected to one another via the word line 33 and, therethrough it is each connected to an output terminal of the word-line driving circuit 35. A description of operations for data writing-in and erasure for the memory cell $31_n$ and the word-line driving circuit 35 is omitted here, because they are almost a same as those for the above-mentioned memory cell $1n$ and the word-line driving circuit 35.

The selecting cell $32_{1n}$ consists of a MOS transistor in such a configuration that its gate is connected to one another via the first column line $34_1$ and, therethrough it is each connected to an output terminal of the column selecting circuit 36, The column selecting circuit 36, applies an "H" level signal to the first column line $34_1$ when it is selected as a result of the first-stage decoding of addresses supplied from outside. When the selecting cell $32_{in}$ is thus supplied at its gate with the "H" level signal, it is turned ON to form a path for reading out data from the memory cell $31_n$.

The selecting cell $32_{2n}$ consists of a MOS transistor in such a configuration that its gate is connected to one another via the second column line $34_2$ and, therethrough it is each connected to an output terminal of the column selecting circuit $36_2$. The column selecting circuit $36_2$ applies an "H" level signal to the second column line $34_2$ when it is selected as a result of the second-stage decoding of addresses supplied from outside. When the selecting cell $32_{2n}$ is thus supplied at its gate with the "H" level signal, it is turned ON to form a path for reading out data from the memory cell $31_n$.

The reading-out circuit 37, when supplied with a data read-out command from outside, supplies an "H" level signal indicating a start of data read-out to the inverter 38, the read-out driving section $39_n$, and the reference section 42. The inverter 38 inverts the "H" level signal thus supplied from the reading-out circuit 37 into an "L" level signal and supplies it to the read-out driving section $39_n$, the buffer $40_n$, the path cutting-off transistors $41_1$ and $41_2$, and the reference section 42.

The reading-out driving section $39_n$ roughly consists of a driving transistor $51_n$, a path forming transistor $52_n$, a path cutting-off transistor $53_n$, and a NOR gate $54_n$.

The driving transistor $51_n$, consisting of a MOS transistor, is turned ON when supplied with an "H" level signal from the reading-out circuit 37, to apply a voltage $V_{Mn}$ which corresponds to the ON-state or the OFF-state of the memory cell $31_n$, to an input terminal of a buffer $40_1$. The path forming transistor $52_n$, consisting of a MOS transistor, is turned ON when supplied with an "H" level signal from the NOR gate $54_n$, to form a path for reading out data from the memory cell $31_n$. The path cutting-off $53_n$, consisting of a MOS transistor, is turned ON when supplied with an "H" level signal from the inverter 38, to cut off the path for reading out data from the memory cell $31_n$. The NOR gate $54_n$ is supplied at its first input terminal with an output signal of the inverter 38 and has its second input terminal connected with a source of the path forming transistor $52_n$, so that when both the output signal of the inverter 38 and the source voltage of the path forming transistor 52, are an "L" level, it outputs an "H" level signal to turn ON the path forming transistor $52_n$.

The buffer $40_1$, roughly consisting of power MOS transistors $55_n$ and $56_n$ and a MOS transistor $57_n$ which constitutes a constant current source, buffers and amplifies the input voltage $V_{Mn}$ and then applies it to the first input terminal of the sense-amplifier $43_1$.

The path cutting-off transistors $41_1$ and $41_2$ are both turned ON by an output signal of the inverter 38, to ground the first and second input terminals of the sense-amplifier $43_1$; that is, when data is not read out, it reduces the input voltages $V_{DM}$ and $V_R$ of the sense-amplifier $43_1$ to 0V.

The reference section 42 roughly includes reference cells $61_1$ and $61_2$, selecting cells $62_{11}$, $62_{12}$, $62_{21}$, and $62_{22}$, a word-line driving circuit 63, column selecting circuits $64_1$ and $64_2$, driving transistors $65_1$ and $65_2$, path forming transistors $66_1$ and $66_2$, path cutting-off transistors $67_1$ and $67_2$, NOR gates $68_1$ and $68_2$, power MOS transistors $69_1$, $69_2$, $70_1$, and $70_2$, and MOS transistors $71_1$ and $71_2$ which constitute a constant current source.

Of the reference cells $61_1$ and $61_2$, both of which are a MOS transistor having the same construction and characteristics as the memory cell $31_n$, the reference cell $61_1$ is set beforehand in the ON-state, a state where no electrons are stored in its floating gate, while the reference cell $61_2$ is set beforehand in the off-state, electrons are stored in its floating gate.

The selecting cells $62_{11}$ and $62_{12}$, the selecting cells $62_{21}$ and $62_{22}$, the word-line driving circuit 63, the column selecting circuit $64_1$, the column selecting circuit 642, the driving transistors $65_1$ and $65_2$, and the path forming transistors $66_1$ and $66_2$ have the same construction and characteristics as the selecting cell $32_{1n}$, the selecting cell $32_{2n}$, the word-line driving circuit 35, the column selecting circuit $36_1$, the column selecting circuit $36_2$, the driving transistor $51_n$, and the path forming transistor $52_n$ respectively. Similarly, the path cutting-off transistors $67_1$ and $67_2$, the NOR gates $68_1$ and $68_2$, the power MOS transistors $69_1$, $69_2$, $70_1$, and $70_2$, and the MOS transistors $71_1$ and $71_2$ have the same construction and characteristics as the path cutting-off transistor $53_n$, the NOR gate $54_n$, the power MOS transistors $55_n$ and $56_n$, and the MOS transistor $57_n$ respectively.

This is so set that the sense-amplifier $43_n$, which includes a differential amplifier, may have its first and second input terminal respectively connected with two loads equal as much as possible.

The driving transistor $65_1$ is turned ON when supplied with an "H" level signal from the reading-out circuit 37, to apply a voltage $V_{Ron}$ which corresponds to the ON-state of the reference cell $61_1$, to the gate of the power MOS transistor $70_1$. Similarly, the driving transistor $65_2$ is turned ON when supplied with an "H" level signal from the reading-out circuit 37, to apply a voltage $V_{Roff}$ which corresponds to the OFF-state of the reference cell $61_2$, to the gate of the power MOS transistor $70_2$.

The power MOS transistors $69_1$ and $70_1$ and the MOS transistor $71_1$ which constitutes the constant current source, in combination, buffer and amplify the output voltage $V_{Ron}$ of the driving transistor $65_1$. The power MOS transistors $69_2$ and $70_2$ and the MOS transistor $71_2$ which constitutes the constant current source, on the other hand, buffer and amplify, in combination, the output voltage $VR_{off}$ of the driving transistor $65_2$. That is, the power MOS transistors $69_1$, $69_2$, $70_1$ and $70_2$ and the MOS transistors $71_1$ and $71_2$ constitute the buffer 72 in combination.

Therefore, assuming that an output current of the power MOS transistor $70_1$ is $I_1$ and that of the power MOS transistor $70_2$ is $I_2$, an average current $I_R$ of these currents $I_1$ and $I_2$ flows as indicated by the following Equation 1 through both of the two constant current sources constituted by the MOS transistors $71_1$ and $71_2$ respectively.

With this, the sense-amplifier $43_n$ is supplied at its second input with an intermediate voltage $V_R$ between the voltage $V_{Ron}$ which corresponds to the ON-state of the reference cell $61_1$ and the voltage $V_{Roff}$ which corresponds to the OFF-state of the reference cell $61_2$, as indicated by the following Equation 2.

$$I_R = (I_1 + I_2)/2 \qquad \qquad 1$$

$$V_R = (V_{Ron} + V_{Roff})/2 \qquad \qquad 2$$

As mentioned above, the sense-amplifier consists of a differential amplifier and so detects and amplifies a difference between the voltage $V_{Dn}$ supplied from the buffer $40_n$ and the voltage $V_R$ supplied from the reference section 42 and then outputs data to the outside via the data bus 44.

Since, as mentioned above, at the second input terminal of the sense-amplifier $43_n$ is applied the intermediate voltage $V_R$ between the voltage $V_{Ron}$ which corresponds to the ON-state of the reference cell $61_1$ and the voltage $V_{Roff}$ which corresponds to the OFF-state of the reference cell $61_2$ (see Equation 2), the voltage $V_R$ is always set automatically at an intermediate value between the voltage $V_{Don}$ given when the memory cell $31_n$ is in the ON-state and the voltage $V_{Doff}$ given when the memory cell $31_n$ is in the OFF-state. With this, it is possible to acquire a margin based on which the ON-state and the OFF-state of the memory cell $31_n$ can be detected.

Further, since, as mentioned above, the voltage $V_R$ is always set automatically at the intermediate value between the voltages $V_{Don}$ and $V_{Doff}$, the voltage $V_{Doff}$ needs only to be a little higher than the voltage $V_R$, so that in order to turn OFF the memory cell $31_n$, it is not necessary to store electrons in the floating gate of the memory cell $31_n$ sufficiently to such an extent that little current would flow through the driving transistor $51_n$ when it is turned ON. With this, the time for writing in data can be reduced as compared to the prior-art embodiment.

Further, in this embodiment, the buffer $40_n$ is provided, so that when the path forming transistor $52_n$, and the selecting cells $32_{1n}$, and $32_{2n}$ are turned ON, the memory cell $31_n$ is not directly connected to the input terminal of the sense-amplifier $43_n$. Therefore, the memory cell $31_n$, when turned ON, needs only to pull down the voltage $V_{Mn}$ applied to the source of the driving transistor $51_n$ from the power supply voltage $V_{CC}$ to a predetermined voltage, thus reducing the data read-out time as compared to the prior-art embodiment.

Still further, in this embodiment, since the sense-amplifier $43_n$ has its two input terminals connected with all the circuit elements having the same construction and characteristics via the buffer $40_n$ and the buffer 72 in the reference section 42, an unbalance state such as occurrence of an offset voltage is not liable to occur in contrast to the prior-art embodiment. Therefore, such an event can be inhibited from occurring that a margin for detecting the ON- and OFF-states of the memory cell 31, may be biased due to such the unbalance. This enables accurate detection and amplification of data, thus improving reliability.

In addition, since the power MOS transistors $70_1$ and $70_2$ which constitute the buffer 72 provided in the reference section 42, in combination, drive as a load the second input terminal of the sense-amplifier $43_n$, the number N of the sense-amplifiers $43_n$ connectable to one reference section 42 can be made at least a double (N=32) of the number M of prior-art embodiment (M=16). This contributes to an enhancement in integration density of the nonvolatile semiconductor memory devices.

Figure 2:
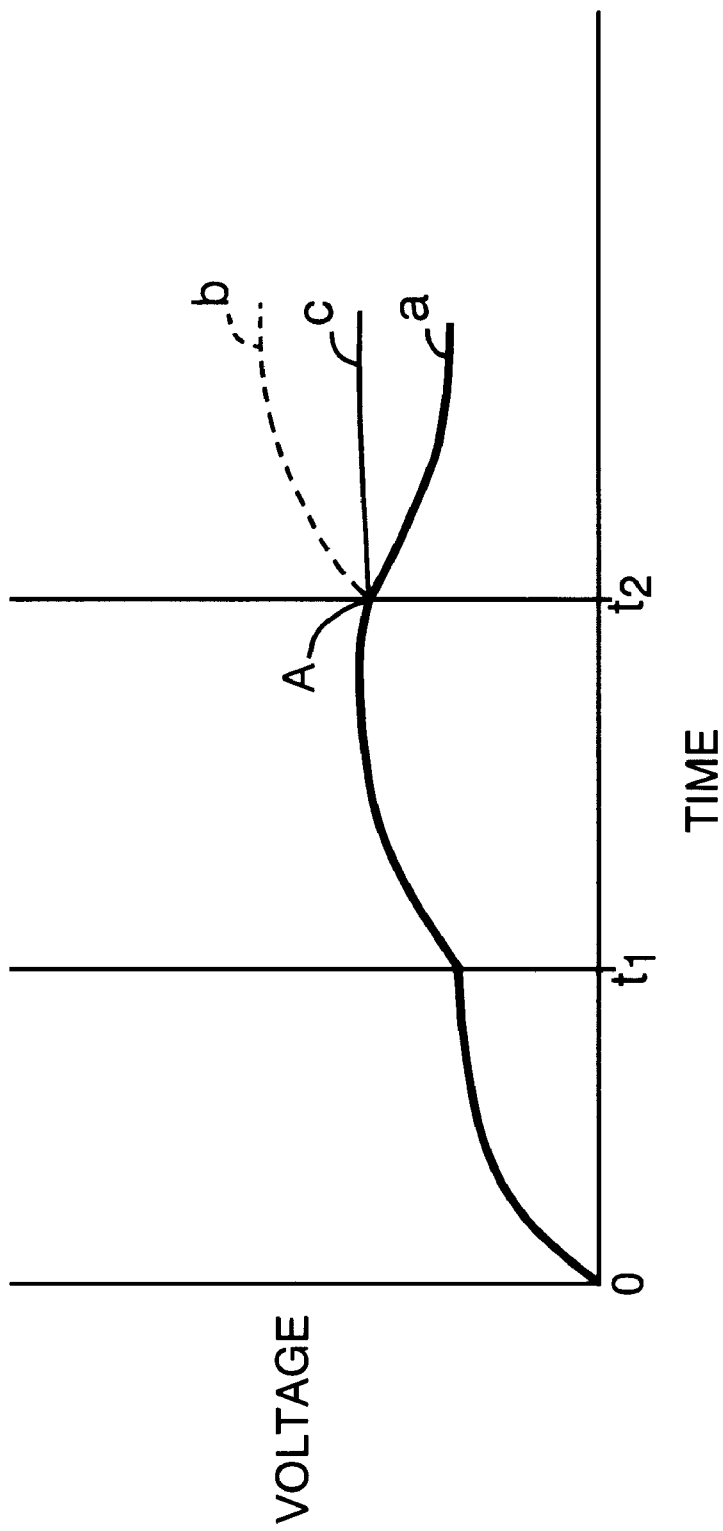
FIG. 2 is a graph indicating waveforms to describe one example of transient characteristics of the present invention device.
Figure 3:
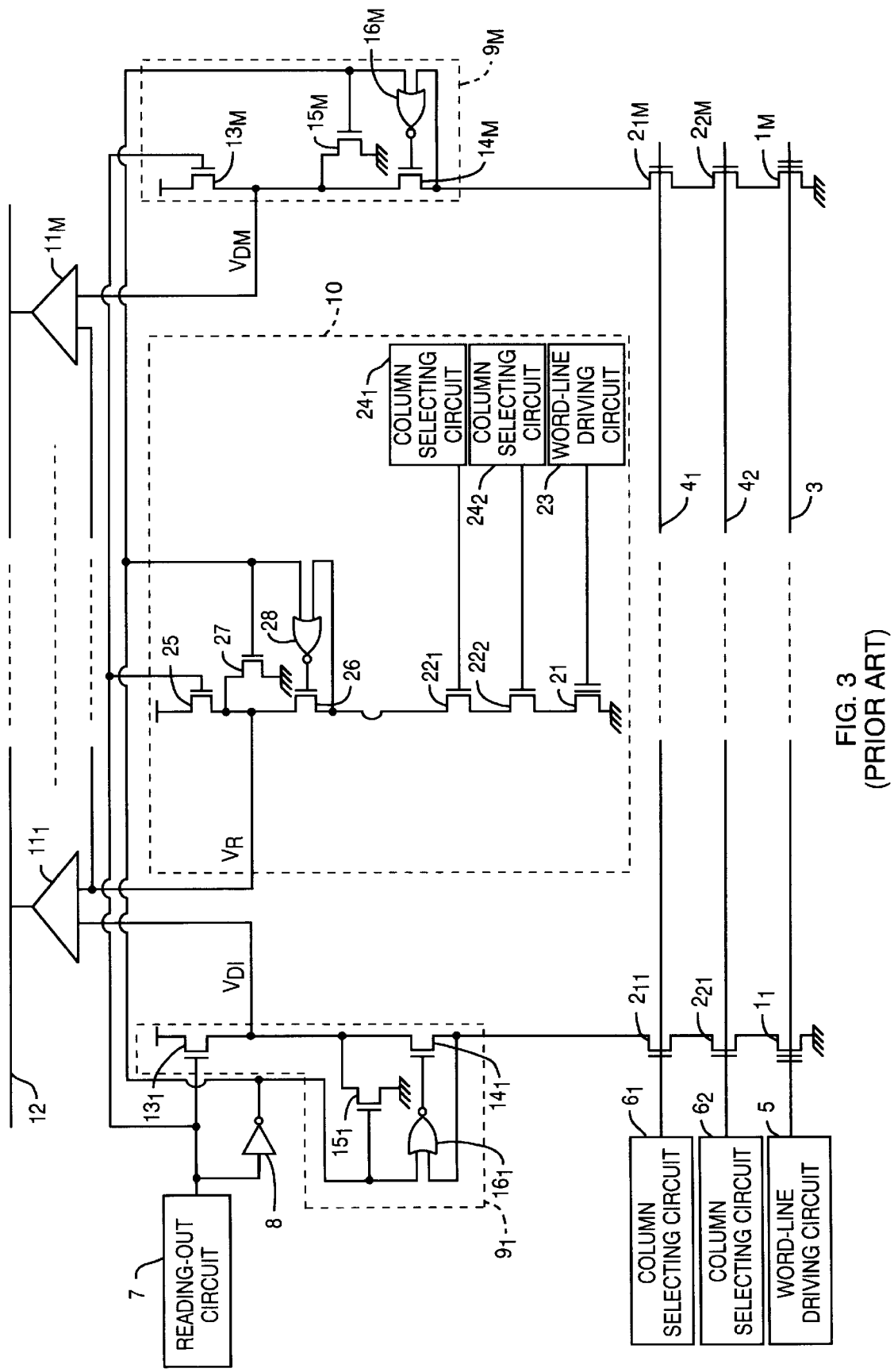
FIG. 3 is a circuit diagram indicating an electric configuration of important parts of a prior-art nonvolatile semiconductor memory device.
Figure 4:
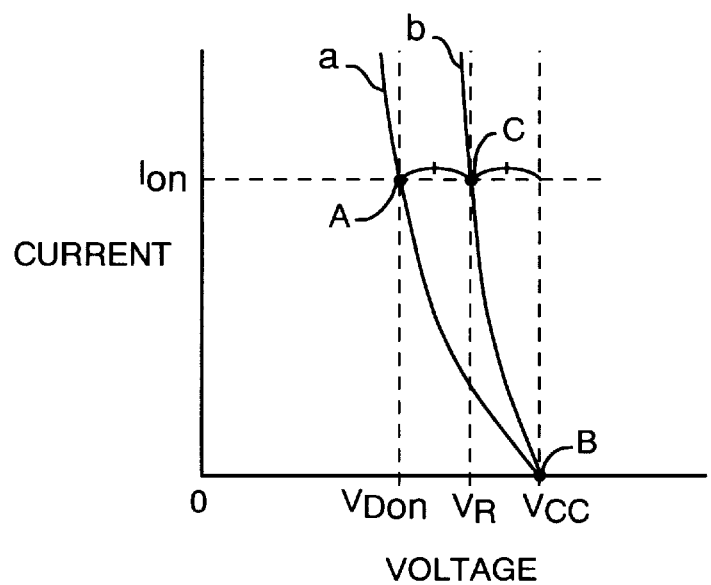
FIG. 4 is a graph describing one example of steady characteristics a same prior-art device.

The following will describe transient properties of a nonvolatile semiconductor memory device having the above-mentioned configuration with reference to FIG. 2.

First, when the device starts to read out data, the voltages $V_{Dn}$ and $V_R$ applied to the first and second input terminals of the sense-amplifier $43_n$ respectively rise in potential in almost the same manner as shown in FIG. 2 up to a time (time $t_1$.) when the selecting cells $32_{1n}$ and $32_{2n}$, the selecting cells $62_{11}$ and $62_{21}$, and the selecting cells $62_{12}$ and $62_{22}$ are turned ON (all of which are turned ON almost simultaneously).

Next, also from a time $t_1$ up to the time (time $t_2$) when an "H" level signal is applied to the word line 33, the voltages $V_{Dn}$ and $V_R$ continue to rise in almost the same manner as shown in FIG. 2. This is because they have roughly the same voltage vs. current characteristics by a fact that the voltage $V_{Mn}$ is amplified by the buffer $40_n$ and applied as the voltage $V_{Dn}$ to the first input terminal of the sense-amplifier $43_n$ as well as by a fact that the voltages $V_{Ron}$ and $V_{Roff}$ generated in the reference section 42 made up by the circuit elements having the same construction and configuration as those of the read-out driving section $39_n$ are amplified by the buffer 72 and its average voltage is applied as the voltage $V_R$ to the second input terminal of the sense-amplifier $43_n$.

When, subsequently, the "H" level signal is applied to the word line 33 (time $t_2$), the voltage $V_R$ continues to rise unchanged in level up to the time $t_2$, whereupon it is saturated, because the word-line driving circuit 63 is a dummy. The voltage $V_{Dn}$, on the other hand, lowers a little in level when no electrons are stored in the floating gate of the memory cell $31_n$, because in such a state, the memory cell $31_n$ is turned ON (see a curve a in FIG. 2) and; contrary when electrons are stored in the floating gate of the memory cell $31_n$ the memory cell $31_n$ stays OFF, so that it further rises in level (see a broken-line curve b in FIG. 2).

Figure 5:
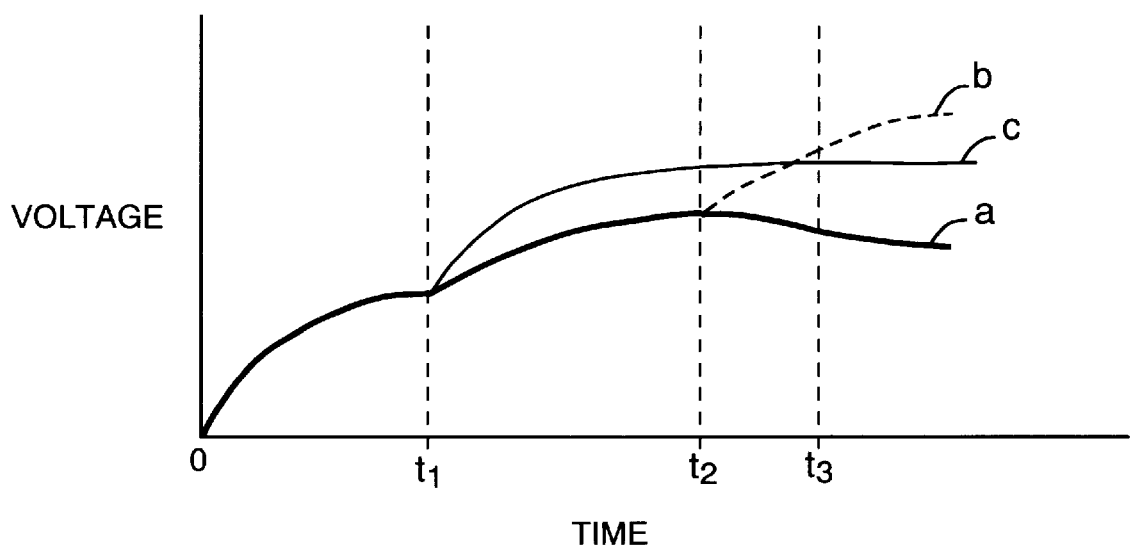
FIG. 5 is a graph indicating waveforms to describe one example of transient characteristics of the same prior-art device.

Therefore, since, from the time $t_2$ on, the curves a through c separate from a point A into three different directions, it is possible to accurately decide whether the voltage $V_{Dn}$ is higher than the voltage $V_R$ to supply necessary data to the data bus 44 without waiting as long as a time lapse ($t_3-t_2$) from a time when the "H" level signal is applied to the word line 33 to a time when the curve b goes beyond the curve c in the case with the prior-art embodiment as shown in FIG. 5.

With this, the time for reading out data can be reduced as compared to the prior-art embodiment.

It is apparent that the present invention is not limited to the above embodiments but may be changed and modified without departing from the scope and spirit of the invention.

For example, although in the above-mentioned embodiment, the buffers $40_n$ and 72 are provided together with the circuit for generating the voltages $V_{Ron}$ and $V_{Roff}$ with the driving transistors $65_1$ and $65_2$ having the same construction and characteristics as the driving transistor $55_n$, the possible embodiments are not limited to this. For example, such a configuration may be possible that the buffer $40_n$ and the buffer including the power MOS transistors $69_1$ and $70_1$ and the MOS transistor 71, are provided together with a circuit for generating the voltage $V_{Ron}$ or $V_{Roff}$ with the driving transistor $65_1$ having the same construction and characteristics as the driving transistor $55_n$ or such a configuration may also be possible that a circuit for generating the voltages $V_{Ron}$ and $V^{Roff}$ is provided with the driving transistors $65_1$ and $65_2$ having the same construction and characteristics as the driving transistor $55_n$.

Also, although in the above-mentioned embodiment, the buffer $40_n$ includes the power MOS transistors $55_n$ and $56_n$ and the MOS transistor $57_1$ and the buffer 72 includes the power MOS transistors $69_1$, $70_1$, and $70_2$ and the MOS transistors $71_1$ and $71_2$, the possible configurations are not limited to this. In short, any configuration is acceptable as far as the buffers $40_n$ and 72 have a high input impedance value and a low output impedance value and their input side is not directly connected with a load, to acquire a sufficiently high current driving capability.

As described above, according to the configuration of the present invention, there are provided the first reference cell held in a state where pseudo-data is written therein and the second reference cell held in the state where pseudo-data is erased therefrom together with the second and third driving transistors which have the same construction and characteristics as the first driving transistor which is turned ON by a signal for reading out data from a memory cell, to supply a current to the memory cell and also which is turned ON by that signal to supply a current to the first and second reference cells, so that an average of the output voltages of the second and third driving transistors respectively may be supplied to the second input terminal of the sense-amplifier, thus reducing time for writing in data as well as time for reading out data.

Also, voltage applied to the second input terminal of the sense-amplifier is always set automatically at an intermediate value between a voltage given when the memory cell is in the ON-state and that given when it is in the OFF-state, thus acquiring a sufficient margin to detect the ON- and OFF-states of the memory cell. This enables the sense-amplifier to accurately detect and amplify data, thus enhancing reliabilities.

Moreover, according to the configuration of the present invention, there are provided the first driving transistor which is turned ON by a signal for reading out data from a memory cell in order to supply a current to the memory cell, the second driving transistor which has a same construction and characteristics as the first driving transistor and which is turned ON by that signal to supply a current to the reference cell, the first buffer for amplifying an output of the first driving transistor and supplying it to the first input terminal of the sense-amplifier, and the second buffer for amplifying an output of the second driving transistor and supplying it to the second input terminal of the sense-amplifier, so that a count of the memory cells that can be integrated in each of them can be increased over the prior-art embodiment, thus enhancing integration density of the nonvolatile semiconductor memory device.

Finally, the present application claims the priority of Japanese Patent Application No. Hei11-127828 filed on May 7, 1999, which is herein incorporated by reference.

What is claimed is:

1. A nonvolatile semiconductor memory device in which, based on a voltage difference between a voltage which corresponds to a data storage state of a memory cell and a voltage which corresponds to a pseudo-data storage state of a reference cell, data stored in said memory cell is readout, said nonvolatile semiconductor memory device comprising:

said reference cell which comprises a first reference cell held in a state where said pseudo-data is written therein and a second reference cell held in a state where said pseudo-data is erased therefrom, a first driving transistor which is turned ON by a signal for reading out said data, to supply a current to said memory cell;

a second driving transistor and a third driving transistor which have same construction and characteristics as said first driving transistor and also which are turned ON by said signal, to supply a current to said first and second reference cells respectively; and a sense-amplifier which has a first input terminal supplied with an output voltage of said first driving transistor a second input terminal supplied with an average of an output voltage of said second driving transistor and an output voltage of said third driving transistor, in order to detect said voltage difference.

2. The nonvolatile semiconductor memory device according to claim 1, wherein said first and second reference cells and said second and third driving transistors are each provided in common to a plurality of memory cells.

3. A nonvolatile semiconductor memory device wherein based on a voltage difference between a voltage which corresponds to a data storage state of a memory cell and a voltage which corresponds to a pseudo-data storage state of a reference cell, data stored in said memory cell is read out, said nonvolatile semiconductor memory device comprising:

a first driving transistor which is turned ON by a signal for reading out said data, to supply a current to said memory cell:

a second driving transistor which has same construction and characteristics as said first driving transistor and also which is turned ON by said signal, to supply a current to said reference cell;

a first buffer for amplifying an output of said first driving transistor and supplying said output to a first input terminal of a sense-amplifier for detecting said voltage difference; and a second buffer for amplifying an output of said second driving transistor and supplying said output to a second input terminal of said sense-amplifier.

4. The nonvolatile semiconductor memory device according to claim 3, wherein said second driving transistor and said second buffer are each provided in common to a plurality of memory cells.

5. A nonvolatile semiconductor memory device in which, based on a voltage difference between a voltage which corresponds to a data storage state of a memory cell and a voltage which corresponds to a pseudo-data storage state of a reference cell, data stored in said memory cell is read out, said nonvolatile semiconductor memory device comprising:

said reference cell which comprises a first reference cell held in a state where said pseudo-data is written therein and a second reference cell held in a state where said pseudo-data is erased therefrom, a first driving transistor which is turned ON by a signal for reading out said data, to supply a current to said memory cell;

a second driving transistor and a third driving transistor which have same construction and characteristics as said first driving transistor which is turned ON by said signal, to supply a current to said first and second reference cells respectively;

a first buffer for amplifying an output of said first driving transistor and supplying said output to a first input terminal of a sense-amplifier for detecting said voltage difference; and a second buffer for amplifying outputs of said second and third driving transistors respectively and supplying an average of said outputs to a second input terminal of said sense-amplifier.

6. The nonvolatile semiconductor memory device according to claim 5, wherein said first and second reference cells and said second and third driving transistors are each provided in common to a plurality of memory cells.

* * * * *